(12) United States Patent
Lee et al.

(10) Patent No.: US 10,777,658 B2
(45) Date of Patent: Sep. 15, 2020

(54) METHOD AND STRUCTURE OF FABRICATING I-SHAPED SILICON VERTICAL FIELD-EFFECT TRANSISTORS

(71) Applicant: International Business Machines Corporation, Armonk, NY (US)

(72) Inventors: ChoongHyun Lee, Rensselaer, NY (US); Kangguo Cheng, Schenectady, NY (US); Juntao Li, Cohoes, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 15/954,876

(22) Filed: Apr. 17, 2018

(65) Prior Publication Data

US 2019/0319118 A1    Oct. 17, 2019

(51) Int. Cl.
*H01L 29/66* (2006.01)
*H01L 29/165* (2006.01)
(Continued)

(52) U.S. Cl.
CPC .. *H01L 29/66666* (2013.01); *H01L 21/02112* (2013.01); *H01L 21/02164* (2013.01); (Continued)

(58) Field of Classification Search
CPC .......... H01L 29/0847; H01L 29/66545; H01L 27/092; H01L 29/66666; H01L 21/02532; H01L 21/823814; H01L 29/42392; H01L 21/823807; H01L 29/0673; H01L 29/6653; H01L 29/66553; H01L 29/785; H01L 29/6656; H01L 29/78696; B82Y 10/00; B82Y 15/00; B82Y 40/00; B82Y 20/00; G11C 13/0007; G11C 13/004; G11C 13/0069; G11C 13/0097; G11C 2013/005; G11C 2013/009; G11C 2213/15;
(Continued)

(56) References Cited

U.S. PATENT DOCUMENTS 8,017,993 B2    9/2011    Kidoh et al.
9,018,084 B2    4/2015    Chang et al.
(Continued)

OTHER PUBLICATIONS

U.S. Appl. No. 15/493,730 filed in the name of R.H. Chao et al. on Apr. 21, 2017 and entitled "Bottom Channel Isolation in Nanosheet Transistors."

*Primary Examiner* — Robert G Bachner
(74) *Attorney, Agent, or Firm* — Vazken Alexanian; Ryan, Mason & Lewis, LLP

(57) ABSTRACT

A method for manufacturing a semiconductor device includes forming a first silicon germanium layer on a semiconductor substrate, forming a silicon layer on the first silicon germanium layer, and a forming second silicon germanium layer on the silicon layer. The method further includes patterning the first and second silicon germanium layers and the silicon layer into at least one fin. In the method, a germanium oxide layer is formed on the substrate and the at least one fin, and annealing is performed to convert the germanium oxide layer formed on the first and second silicon germanium layers into silicon oxide. Remaining portions of the germanium oxide layer are removed, and a width of the silicon layer is reduced.

17 Claims, 9 Drawing Sheets

(51) Int. Cl.
*H01L 21/02* (2006.01)
*H01L 29/08* (2006.01)
*H01L 29/78* (2006.01)
*H01L 29/10* (2006.01)
*H01L 21/324* (2006.01)
*H01L 21/311* (2006.01)
*H01L 21/306* (2006.01)
*H01L 21/033* (2006.01)

(52) U.S. Cl.
CPC .. *H01L 21/02255* (2013.01); *H01L 21/02532* (2013.01); *H01L 21/324* (2013.01); *H01L 29/0847* (2013.01); *H01L 29/1037* (2013.01); *H01L 29/165* (2013.01); *H01L 29/6656* (2013.01); *H01L 29/7827* (2013.01); *H01L 21/0228* (2013.01); *H01L 21/0337* (2013.01); *H01L 21/30604* (2013.01); *H01L 21/31116* (2013.01)

(58) Field of Classification Search
CPC ............ G11C 2213/32; G11C 2213/71; B01L 3/502715; B01L 2300/06; B01L 2300/0627; B01L 2300/0838; B01L 2300/0851; B01L 2300/0887; B01L 2300/0896; B01L 2300/16; B01L 2400/02; B01L 2400/0433; B01L 2400/0475; B01L 2400/0478; B01L 3/021; B01L 3/502707; B01L 3/50273; B01L 3/502784

See application file for complete search history.

(56) References Cited

U.S. PATENT DOCUMENTS

| | | |
|---|---|---|
| 9,276,013 B1 * | 3/2016 | Doris .................. H01L 27/1211 |
| 9,306,063 B2 | 4/2016 | Doyle et al. |
| 9,312,183 B1 | 4/2016 | Kim et al. |
| 9,349,868 B1 | 5/2016 | Balakrishnan et al. |
| 9,502,265 B1 | 11/2016 | Jiang et al. |
| 9,773,870 B1 | 9/2017 | Cheng et al. |
| 10,319,833 B1 * | 6/2019 | Jagannathan ....... H01L 29/0653 |
| 2009/0258470 A1 | 10/2009 | Choi et al. |
| 2015/0144998 A1 | 5/2015 | Ching et al. |
| 2015/0263003 A1 | 9/2015 | Lee et al. |
| 2016/0005852 A1 | 1/2016 | Kim et al. |
| 2016/0293736 A1 | 10/2016 | Cheng et al. |
| 2017/0288056 A1 | 10/2017 | Balakrishnan et al. |
| 2018/0108577 A1 * | 4/2018 | Zhu ..................... H01L 29/0847 |
| 2018/0254344 A1 | 9/2018 | Cheng et al. |
| 2018/0308986 A1 | 10/2018 | Chao et al. |

* cited by examiner

METHOD AND STRUCTURE OF FABRICATING I-SHAPED SILICON VERTICAL FIELD-EFFECT TRANSISTORS

TECHNICAL FIELD

The field generally relates to semiconductor devices and methods of manufacturing same and, in particular, to forming vertical field effect transistor (VFET) having a fin structure which reduces parasitic resistance.

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into fin-like shapes and functions as the channels of the transistors. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field effect transistors (VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch, providing a FinFET-equivalent density at a larger contacted poly pitch (CPP), and providing lower MOL resistance.

Conventional VFETs have a drawback of high parasitic resistance at the top junction between the fin channel and top source/drain region, which can be attributed to a small conduction path at the top of the fin. More specifically, due to oxidation consuming upper portions of the fins during processing, fins in conventional VFETs have a tapered shape, with a larger width at a bottom of the fin and a smaller width at the top of the fin. The smaller width at the top of the fin results in the small conduction path at the top of the fin.

Accordingly, there is a need for a VFET with reduced parasitic resistance at the top junction.

SUMMARY

According to an exemplary embodiment of the present invention, a method for manufacturing a semiconductor device includes forming a first semiconductor layer having germanium on a semiconductor substrate, forming a second semiconductor layer on the first semiconductor layer, and forming a third semiconductor layer comprising germanium on the second semiconductor layer. The method further includes patterning the first, second and third semiconductor layers into at least one fin, and forming a germanium oxide layer on the substrate and the at least one fin. In the method, an annealing process is performed to convert the germanium oxide layer formed on the first and third semiconductor layers into silicon oxide, remaining portions of the germanium oxide layer are removed from the at least one fin and the substrate, and a width of the second semiconductor layer of the at least one fin is reduced. A bottom source/drain region is grown from the substrate adjacent a base portion of the at least one fin, a gate structure is formed on and around the second semiconductor layer, and a top source/drain region is grown from the third semiconductor layer.

According to an exemplary embodiment of the present invention, a vertical field-effect transistor device includes at least one fin disposed on a semiconductor substrate, wherein the at least one fin includes a first semiconductor layer including germanium, a second semiconductor layer on the first semiconductor layer, and a third semiconductor layer including germanium on the second semiconductor layer. The first and third semiconductor layers have a greater width than the second semiconductor layer. The device further includes a bottom source/drain region adjacent a lower portion of the at least one fin, a gate structure on the bottom source/drain region, and a top source/drain region extending from the third semiconductor layer.

According to an exemplary embodiment of the present invention, a method for manufacturing a vertical field-effect transistor includes forming a first silicon germanium layer on a semiconductor substrate, forming a silicon layer on the first silicon germanium layer, and a forming second silicon germanium layer on the silicon layer. The method further includes patterning the first and second silicon germanium layers and the silicon layer into at least one fin. In the method, a germanium oxide layer is formed on the substrate and the at least one fin, and annealing is performed to convert the germanium oxide layer formed on the first and second silicon germanium layers into silicon oxide. Remaining portions of the germanium oxide layer are removed, and a width of the silicon layer is reduced. In addition, a bottom source/drain region is grown from the substrate adjacent a base portion of the at least one fin, a gate structure is formed on and around the silicon layer, and a top source/drain region is grown from the second silicon germanium layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
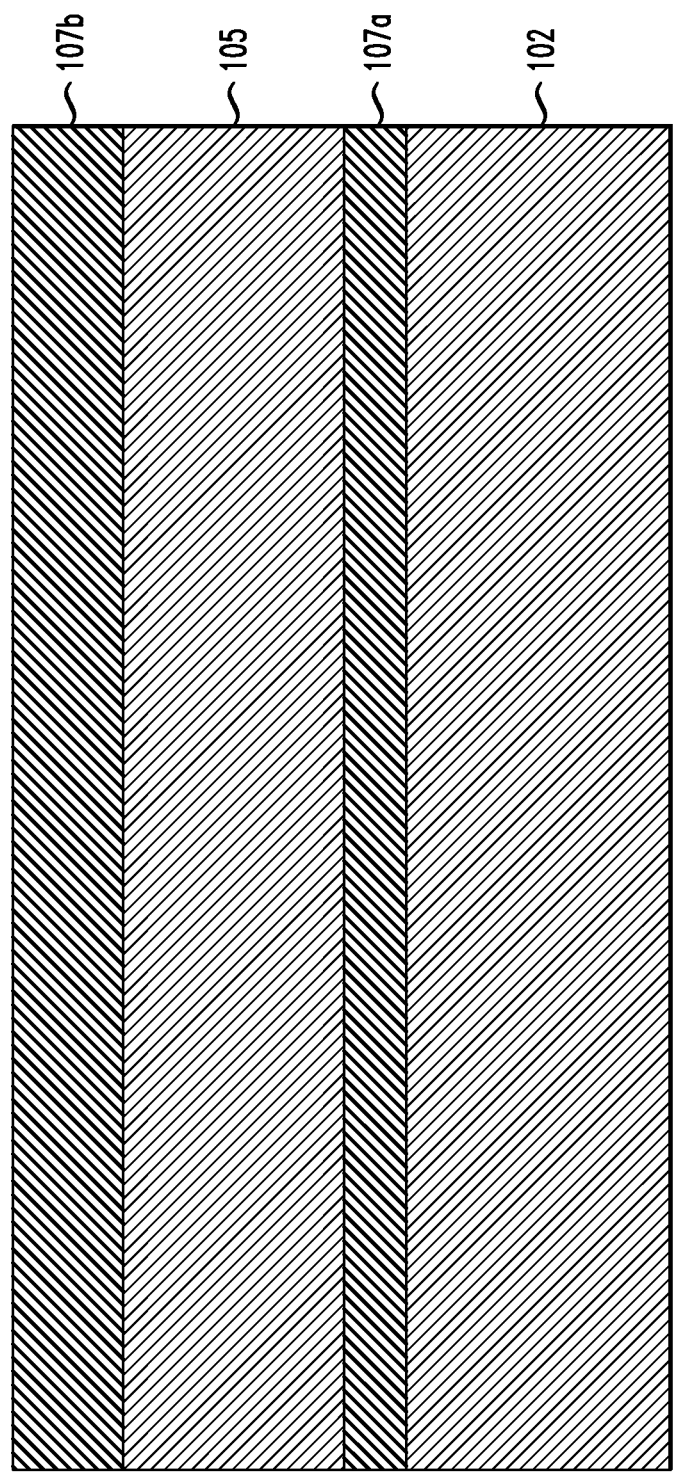
FIG. 1 is a cross-sectional view illustrating growth of a plurality of semiconductor layers on a substrate in a method of manufacturing a semiconductor device, according to an exemplary embodiment of the present invention.

Exemplary embodiments of the invention will now be discussed in further detail with regard to semiconductor devices and methods of manufacturing same and, in particular, to VFET devices having fins which are structured to result in wide conduction paths at top and bottom source/drain junctions.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention correspond to methods of fabricating and structures for I-shaped VFETs, which can reduce a parasitic resistance at top junctions between vertical fins (e.g., vertical channel regions) and top source/drain regions. Embodiments of the present invention utilize self-aligned $SiO_2$ nanomask layers adjacent top and bottom silicon germanium (SiGe) portions of fins to preserve a larger fin width at top and bottom portions of the fins. Embodiments of the present invention utilize a reaction between germanium oxide ($GeO_2$) and the SiGe portions to selectively form the self-aligned $SiO_2$ nanomask layers.

VFET devices formed in accordance with embodiments of the present invention form wider conduction paths at the top and bottom of fins, which reduce parasitic resistance at the top and bottom junctions when compared with conventional VFET devices.

FIG. 1 is a cross-sectional view illustrating growth of a plurality of semiconductor layers on a substrate in a method of manufacturing a semiconductor device, according to an exemplary embodiment of the present invention. Referring to FIG. 1, semiconductor layers 105, 107a and 107b are epitaxially grown on a semiconductor substrate 102. In accordance with an embodiment of the present invention, the substrate 102 comprises, a semiconductor material including, but not necessarily limited to, silicon (Si), silicon carbide (SiC), Si:C (carbon doped silicon), a II-V or III-V compound semiconductor or other like semiconductor. In addition, multiple layers of the semiconductor materials can be used as the semiconductor material of the substrate 102. In accordance with an embodiment of the present invention, the semiconductor layer 105 comprises a semiconductor material including, but not necessarily limited to, silicon or other semiconductor material, and the semiconductor layers 107*a* and 107*b* comprise a semiconductor material including, but not necessarily limited to, silicon germanium (SiGe) or other semiconductor material, which, for example, have less than 20% germanium, but the embodiments of the present invention are not necessarily limited thereto. In accordance with an embodiment of the present invention, a resulting vertical height (e.g., thickness) of the semiconductor layer 105 after epitaxial growth is about 20 nm to about 100 nm and a resulting vertical height (e.g., thickness) of the semiconductor layers 107*a* and 107*b* after epitaxial growth are about 5 nm to about 20 nm, and about 5 nm to about 20 nm, respectively.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultrahigh vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
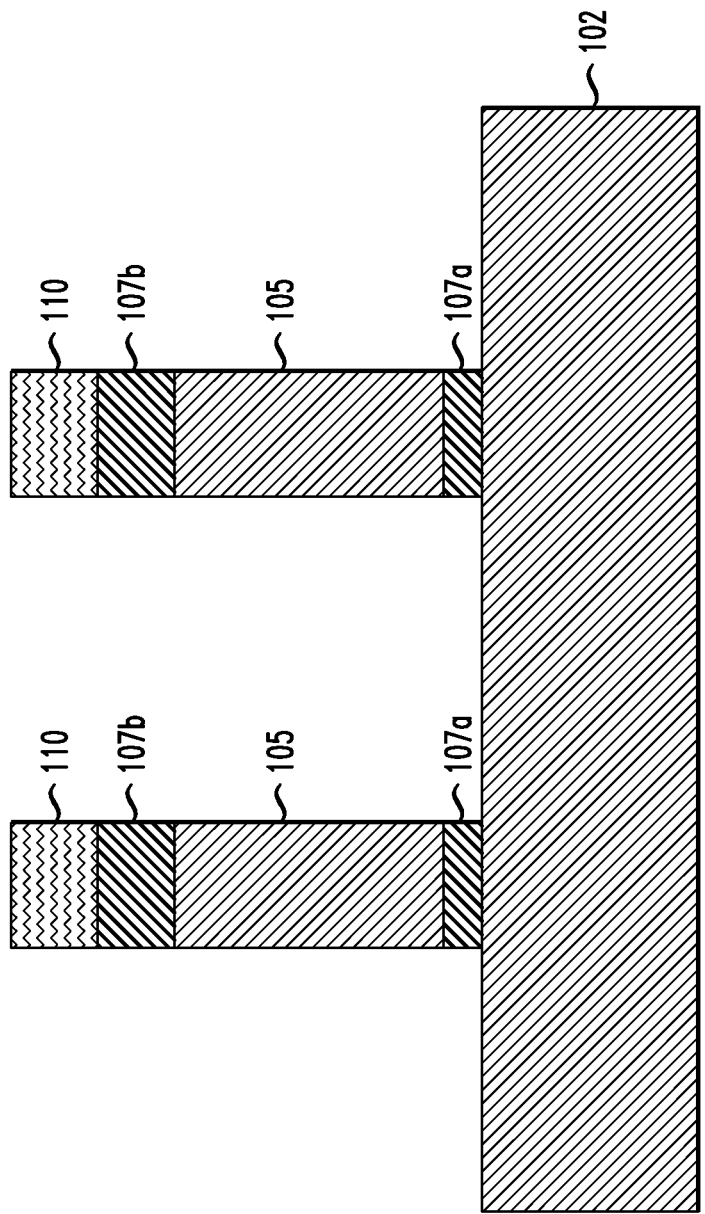
FIG. 2 is a cross-sectional view illustrating fin formation in a method of manufacturing a semiconductor device, according to an exemplary embodiment of the present invention.

FIG. 2 is a cross-sectional view illustrating fin formation in a method of manufacturing a semiconductor device, according to an exemplary embodiment of the present invention. Referring to FIG. 2, the blanket layers 105, 107*a* and 107*b* on the substrate are patterned into a plurality of fins including patterned stacks of the remaining layers 107*a*, 105 and 107*b* after the patterning, which are each under a hardmask layer 110. For ease of explanation, two fins are shown in FIG. 2. However, the embodiments of the present invention are not necessarily limited thereto, and the blanket layers 105, 107*a* and 107*b* can be patterned into more or less than two fins.

According to an embodiment, the hardmasks 110 including, for example, a dielectric material, such as silicon nitride (SiN) is formed on the portions of the blanket layers 105, 107*a* and 107*b* that are to be formed into the fins. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes.

According to an embodiment of the present invention, the thickness of the fins as a result of the patterning is about twice a target thickness of the fins in the resulting VFET device. In a non-limiting illustrative example, a thickness of the fins in FIG. 2 may be about 14 nm-16 nm for a target thickness of about 7 nm to 8 nm.

Figure 3:
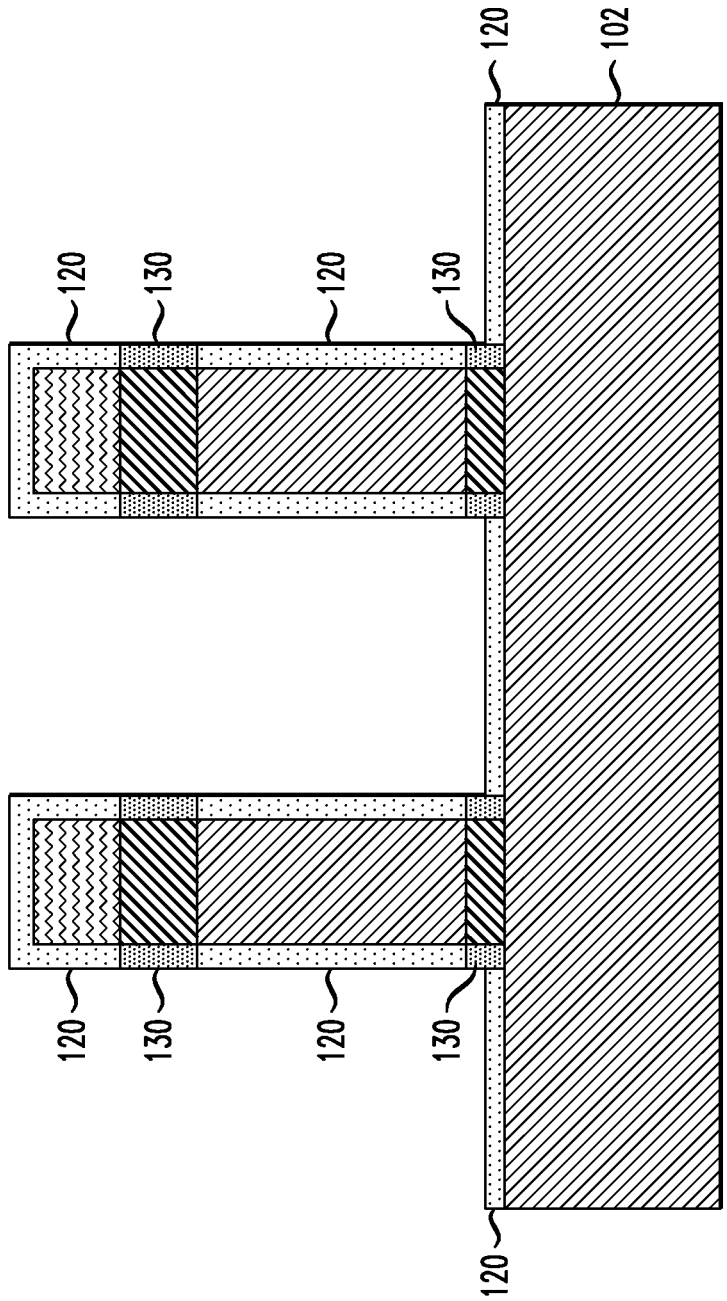
FIG. 3 is a cross-sectional view illustrating germanium oxide deposition and mask layer formation in a method of manufacturing a semiconductor device, according to an exemplary embodiment of the present invention.

FIG. 3 is a cross-sectional view illustrating germanium oxide deposition and mask layer formation in a method of manufacturing a semiconductor device, according to an exemplary embodiment of the present invention. Referring to FIG. 3, a germanium oxide ($GeO_2$) layer 120 is deposited using, for example, atomic layer deposition (ALD) or other conformal deposition process, on the structure from FIG. 2, including on the stacked structures including the remaining portions of layers 107*a*, 105 and 107*b* and the hardmask layer 110, and on the exposed portions of the substrate 102. In a non-limiting embodiment, a thickness of the $GeO_2$ layer 120 can be in the range of about 3 nm to about 10 nm.

After deposition of the $GeO_2$ layer, a thermal annealing process is performed in, for example, nitrogen ($N_2$), argon (Ar), helium (He), xenon (Xe), and/or hydrogen at a temperature range of, for example, about 450° C. to about 650° C. The thermal annealing process results in the conversion of the $GeO_2$ layer into a layer 130 on the layers 107*a* and 107*b*, which comprise SiGe. The layers 130 comprise silicon oxide ($SiO_x$), where x is, for example, 2 in the case of silicon dioxide ($SiO_2$), or 1.99 or 2.01. For ease of explanation, the disclosure will refer to the layers 130 as $SiO_2$ layers.

The thermal annealing process does not cause the $GeO_2$ layer 120 on the remaining portion of the silicon substrate 102, on the silicon layers 105 and on the hardmask layer 110 (e.g., SiN) to be converted into $SiO_2$.

According to an embodiment of the present invention, during the thermal annealing process, the annealing conditions cause the Si in the SiGe portions 107a and 107b of the fins to bond with the oxygen in the $GeO_2$ layer 120 to form $SiO_2$ layers 130. The Si in the SiGe fin does not bond with the Ge in the $GeO_2$ layer 120. As a result, the Ge from the $GeO_2$ layer 120 is driven into the inner portions of the layers 107a and 107b and the Si from the inner portions of the layers 107a and 107b is driven out of the layers 107a and 107b to bond with the oxygen, which forms higher Ge % SiGe portions 107a and 107b. The resulting Ge concentration (e.g., atomic percentage) in the SiGe portions 107a and 107b after thermal annealing is higher than the Ge concentration in those layers prior to the thermal annealing.

In accordance with embodiments of the present invention, the annealing can be performed at a temperature range of about 450° C.-about 650° C., in an environment including nitrogen, argon, xenon, helium, hydrogen, or any suitable combination of those gases, for a time period 1 millisecond to 30 minutes. The anneal can be done by rapid thermal annealing (RTP), furnace annealing, flash annealing, laser annealing, spike annealing, or any suitable combination of those techniques.

In accordance with an embodiment of the present invention, the annealing may be carried out for a variable period of time. In one example, the annealing process is carried out for a time period from about 0.5 seconds to 2 seconds, depending on temperature and germanium concentration in the SiGe layers 107a and 107b. The annealing process may be carried out at a single targeted temperature, or at various ramp and soak cycles using various ramp rates and soak times.

By way of further explanation, in accordance with an embodiment of the present invention, the Si atoms in the SiGe portions 107a and 107b bond with available oxygen from the $GeO_2$ layer 120 during the annealing process to form the $SiO_2$ layers 130.

Figure 4:
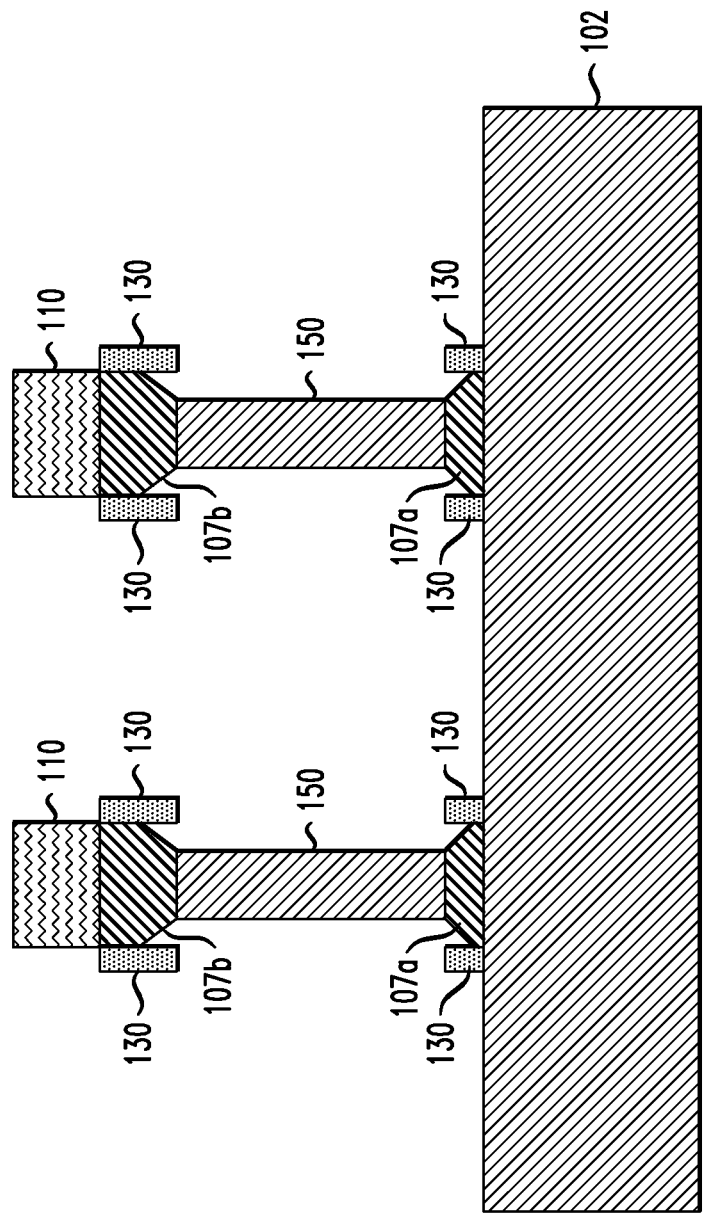
FIG. 4 is a cross-sectional view illustrating germanium oxide removal and fin trimming in a method of manufacturing a semiconductor device, according to an exemplary embodiment of the present invention.

FIG. 4 is a cross-sectional view illustrating germanium oxide removal and fin trimming in a method of manufacturing a semiconductor device, according to an exemplary embodiment of the present invention. Referring to FIG. 4, the unreacted $GeO_2$ layer 120 is water soluble, and is removed using, for example, a water based agent, such as, for example, deionized water (DI water). The unreacted portions of the $GeO_2$ layer 120 are removed from the stacked structures including the remaining portions of layers 105 and the hardmask layer 110, and from the substrate 102.

Then, using, for example, a wet or dry etch process including, for example, tetramethylammonium hydroxide (TMAH) or potassium hydroxide (KOH), the portions 105 of the fins exposed after removal of the unreacted portions of the $GeO_2$ layer 120 are trimmed to reduce a width of the layers 105 to a target width of the fins (e.g., about 7 nm to about 8 nm as noted herein above). The layers 107a and 107b are covered by the $SiO_2$ layers 130 during the removal (e.g., trimming) process, and remain at or near the original patterned width after the patterning described in connection with FIG. 2. However, as can be seen in FIG. 4, parts of the SiGe portions 107a and 107b adjacent the layers 105 are affected by the etchant during the removal process and removed to result in the structure or a similar structure to that shown in FIG. 4, where upper corner parts of layers 107a and lower corner parts of layers 107b are removed. As shown in FIG. 4, in accordance with an embodiment of the present invention, at least a bottom portion of layers 107a adjacent the substrate 102 and a top portion of layers 107b adjacent the hardmasks 110 are at or near the original width, while the portions 105 have a uniform or substantially uniform width which is less than a width of the bottom portion of layers 107a and the top portion of layers 107b. As can be seen in FIG. 4, after trimming, the fin including layers 107a, 105 and 107b has an "I" shape.

Figure 5:
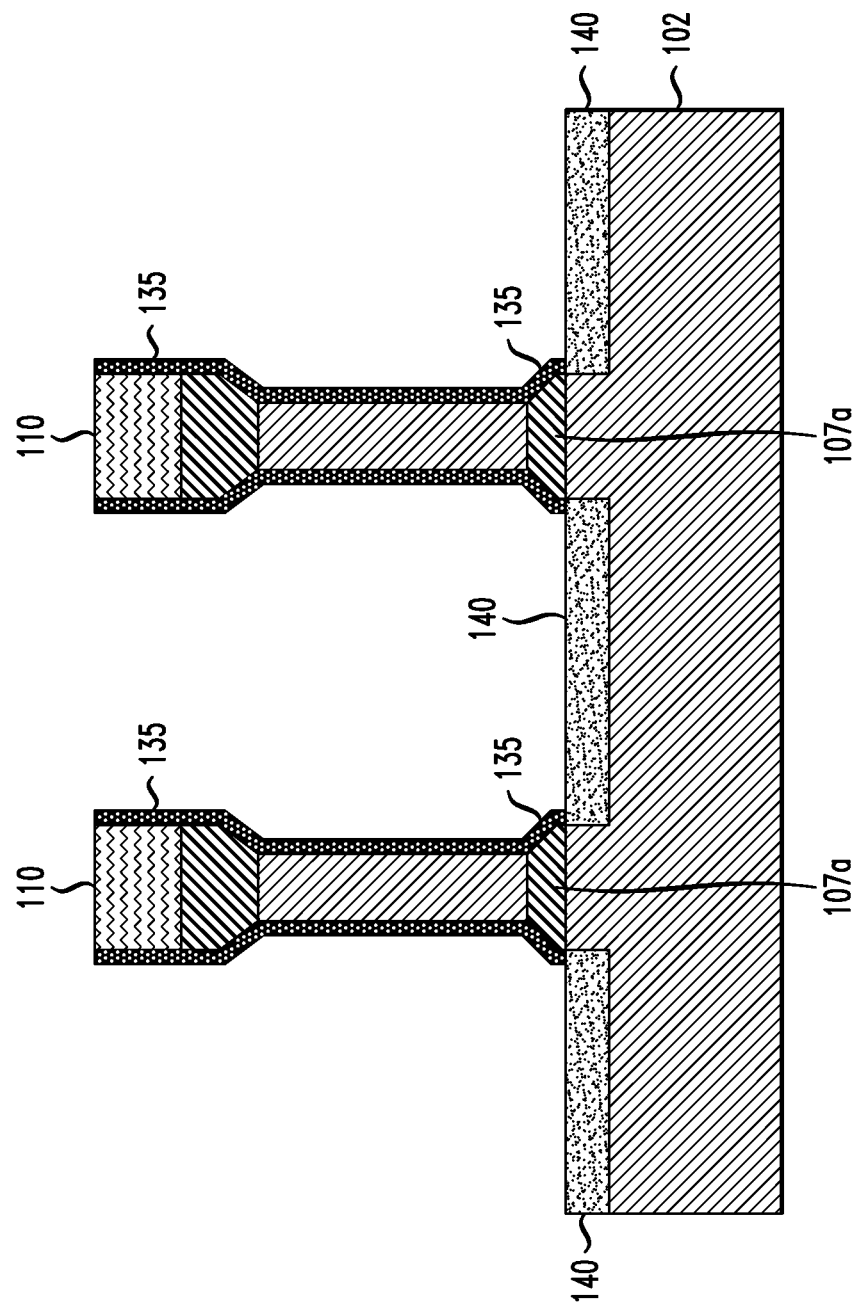
FIG. 5 is a cross-sectional view illustrating growth of bottom source/drain regions in a method of manufacturing a semiconductor device, according to an exemplary embodiment of the present invention.

FIG. 5 is a cross-sectional view illustrating growth of bottom source/drain regions in a method of manufacturing a semiconductor device, according to an exemplary embodiment of the present invention. Referring to FIG. 5, following the trimming process, the $SiO_2$ layers 130 are removed using a wet or dry etch process including, for example, diluted HF solution. Then, a mask layer 135 comprising, for example, SiN, is deposited using, for example, ALD or other conformal deposition process. Horizontal portions of the deposited mask layer 135 are removed using a directional (e.g., anisotropic) removal process, such as, for example, reactive ion etching (ME) to result in the mask layer 135 as shown in FIG. 5, on the stacked structures including the remaining portions of the layers 105, 107a and 107b under the hardmask layers 110.

With the stacked structures covered by the mask layer 135 as shown in FIG. 5, portions of the substrate 102 between the stacked structures are recessed to, for example, a depth of about 20 nm to about 60 nm. Recessing of the substrate 102 is performed using, for example, directional ME with fluorine or chlorine-based gases or wet etching with a hydrofluoric acid etchant. Then, bottom source/drain regions 140 are epitaxially grown in a bottom-up epitaxial growth process from the recessed portions of the substrate 102 in trenches formed by the recessing. The epitaxially grown bottom source/drain regions 140 can be doped using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1e18/cm^3$ to $1e21/cm^3$.

Figure 6:
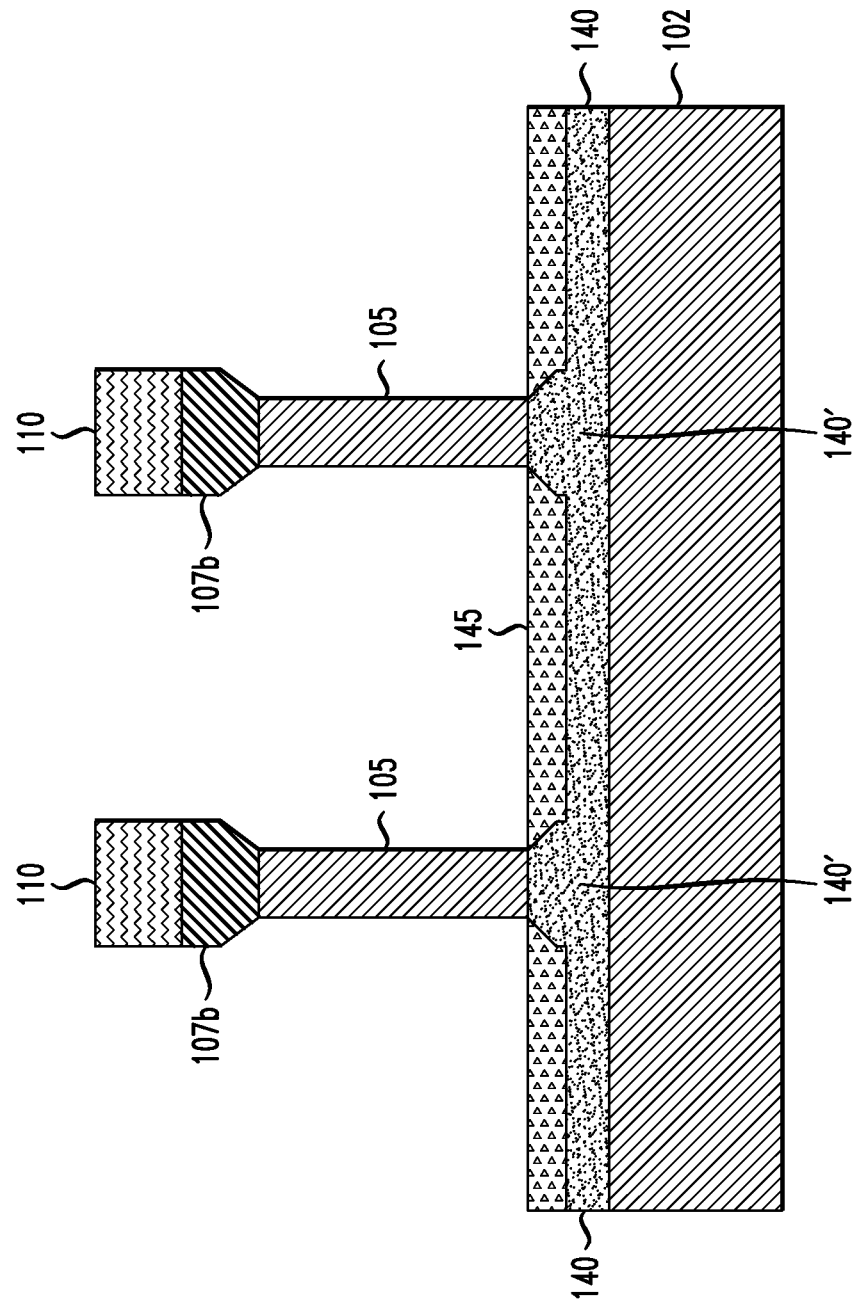
FIG. 6 is a cross-sectional view illustrating junction annealing and bottom spacer formation in a method of manufacturing a semiconductor device, according to an exemplary embodiment of the present invention.

FIG. 6 is a cross-sectional view illustrating junction annealing and bottom spacer formation in a method of manufacturing a semiconductor device, according to an exemplary embodiment of the present invention. Referring to FIG. 6, the mask layer 135 is removed using, for example, a wet etch process using diluted HCl solution. The bottom junctions 140' between the bottom source/drain region 140 and the fins are formed by an annealing process, which causes dopant diffusion into the layers 107a (e.g., SiGe layers) and parts of the substrate 102 under the layers 107a from the bottom source/drain region 140. The resulting bottom junctions 140' include the portions formerly labeled as 107a, which retain the same shape and include SiGe, but after diffusion also include the diffused dopant. A doping concentration can be higher at areas of the fins closer to the source/drain region 140 than at areas of the fins farther away from the source/drain regions 140. The annealing process can be, for example, a drive-in annealing process performed at temperatures in the range of, for example, about 800° C. to 1300° C. and for durations in the range of, for example, about 0.01 seconds to 10 minutes.

A bottom spacer 145 is formed on exposed horizontal or nearly horizontal surfaces including the bottom source/drain region 140 and on side portions of bottom junctions 140', which were previously the layers 107a. Spacer material includes, but is not necessarily limited to, plasma enhanced chemical vapor deposition (PECVD)-type, high aspect ratio process (HARP)-type or high density plasma (HDP)-type low-K dielectric layers, including, but not necessarily limited to, silicon boron nitride (SiBN), siliconborocarbonitride (SiBCN), silicon oxycarbonitride (SiOCN), SiN or $SiO_2$. The bottom spacer 145 is deposited using, for example, directional deposition techniques, including, but not necessarily limited to high density plasma (HDP) deposition and gas cluster ion beam (GCIB) deposition. The directional deposition deposits the spacer material preferably on the exposed horizontal or nearly horizontal surfaces, but not on lateral sidewalls. Spacer material formed on the hardmasks 110 (not shown) will later be removed during subsequent planarization steps.

Figure 7:
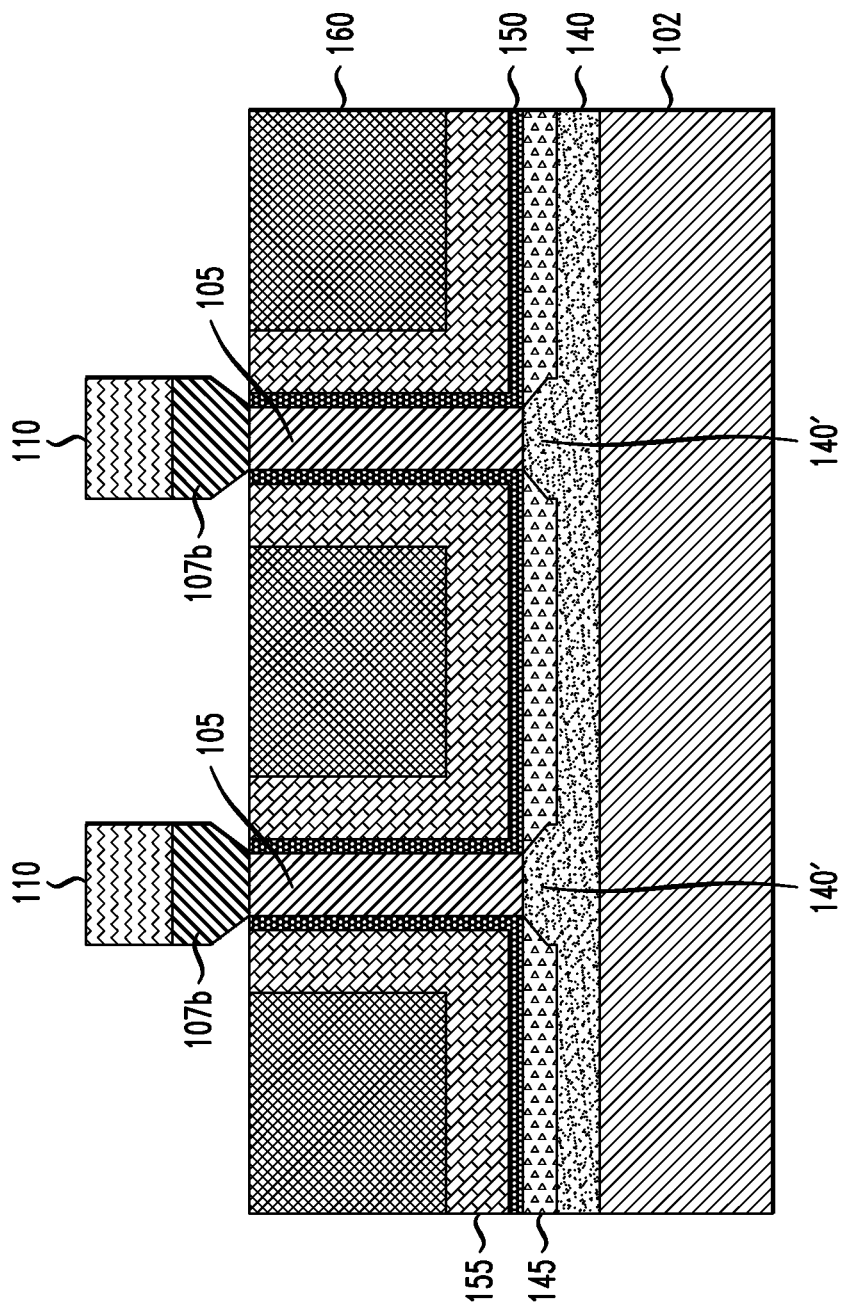
FIG. 7 is a cross-sectional view illustrating gate structure formation in a method of manufacturing a semiconductor device, according to an exemplary embodiment of the present invention.

FIG. 7 is a cross-sectional view illustrating gate structure formation in a method of manufacturing a semiconductor device, according to an exemplary embodiment of the present invention. Referring to FIG. 7, the gate structures include gate layers 155 and dielectric layers 150. The dielectric layers 150 include, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate layers 155 include, for example, a work-function metal (WFM) layer, including but not necessarily limited to, for a p-type FET (pFET), titanium nitride (TiN), tantalum nitride (TaN) or ruthenium (Ru), and for an n-type FET (nFET), TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate layers 155 further include a gate conductor including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structures are deposited on the spacers 145 on and around the fins (e.g., each layer 105), using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), sputtering, and/or plating.

In accordance with an embodiment of the present invention, an organic planarization layer (OPL) 160 is formed on the gate structures including the gate and dielectric layers 155 and 150. The OPL material may be an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 160 can be deposited, for example, by spin coating.

A planarization process, such as, for example, chemical mechanical polishing (CMP), is performed to remove excess portions of the gate structures, OPL and spacer material on the hardmasks 110.

The OPL 160 and the gate structures including the gate layers 155 and the dielectric layers 150 are recessed using, for example, an anisotropic etch process, such as RIE, ion beam etching, plasma etching or laser ablation. As can be seen, the OPL 160 and the gate structures are recessed to a height above the substrate 102 below the remaining SiGe portions 107b to be level with or substantially level with an upper surface of the remaining semiconductor layers 105. According to an embodiment, recessing is performed by a wet or dry etching process that is selective with respect to materials of the remaining SiGe portions 107b and the hardmasks 110. Etch chemistry for recessing the OPL 160 and the gate structures can include, for example, sulfur hexafluoride ($SF_6$) and nitrogen ($N_2$)/hydrogen ($H_2$).

Figure 8:
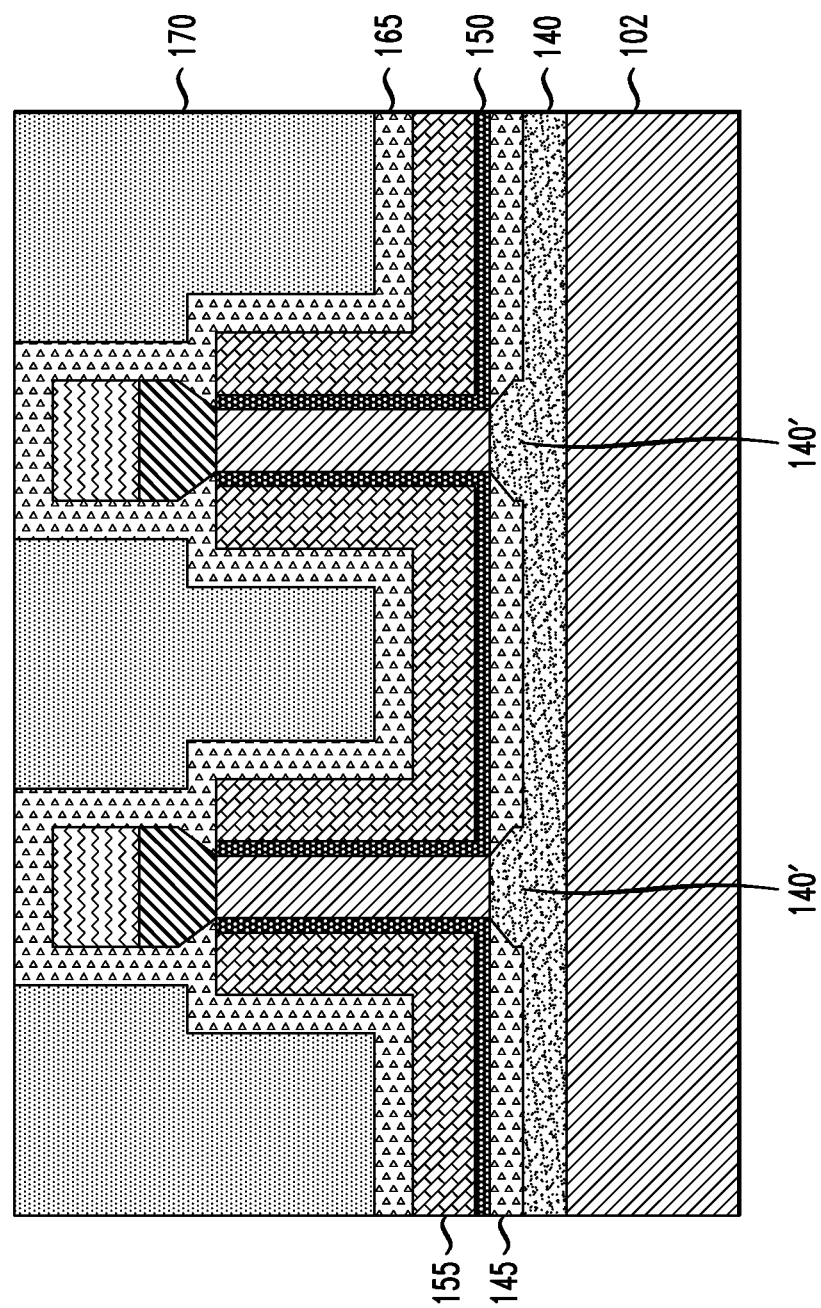
FIG. 8 is a cross-sectional view illustrating gate encapsulation and dielectric deposition in a method of manufacturing a semiconductor device, according to an exemplary embodiment of the present invention.

FIG. 8 is a cross-sectional view illustrating gate encapsulation and dielectric deposition in a method of manufacturing a semiconductor device, according to an exemplary embodiment of the present invention. Referring to FIG. 8, the OPL 160 is stripped using, for example, oxygen plasma, nitrogen plasma, hydrogen plasma or other carbon strip process. OPL stripping causes minimal or no damage to the layers 105, 107b, 110, 150 and 155. Following stripping of the OPL 160, a gate encapsulation layer 165, comprising, for example, a nitride, such as SiN, is deposited on the gate layers 155, layers 107b and on the hardmasks 110 using ALD or other conformal deposition technique.

Then, a dielectric layer 170 comprising, for example, silicon oxide ($SiO_2$), silicon oxycarbide (SiOC), silicon oxycarbonitride (SiOCN) or some other dielectric is formed on the exposed portions of the structure including the deposited gate encapsulation layer 165. The dielectric layer 170 is deposited using a deposition process, such as, for example, CVD, PECVD, PVD, ALD, MBD, PLD, LSMCD, and/or spin-on coating. The deposited layer is planarized down to the gate encapsulation layer 165 using a planarization process, such as, for example, CMP.

Figure 9:
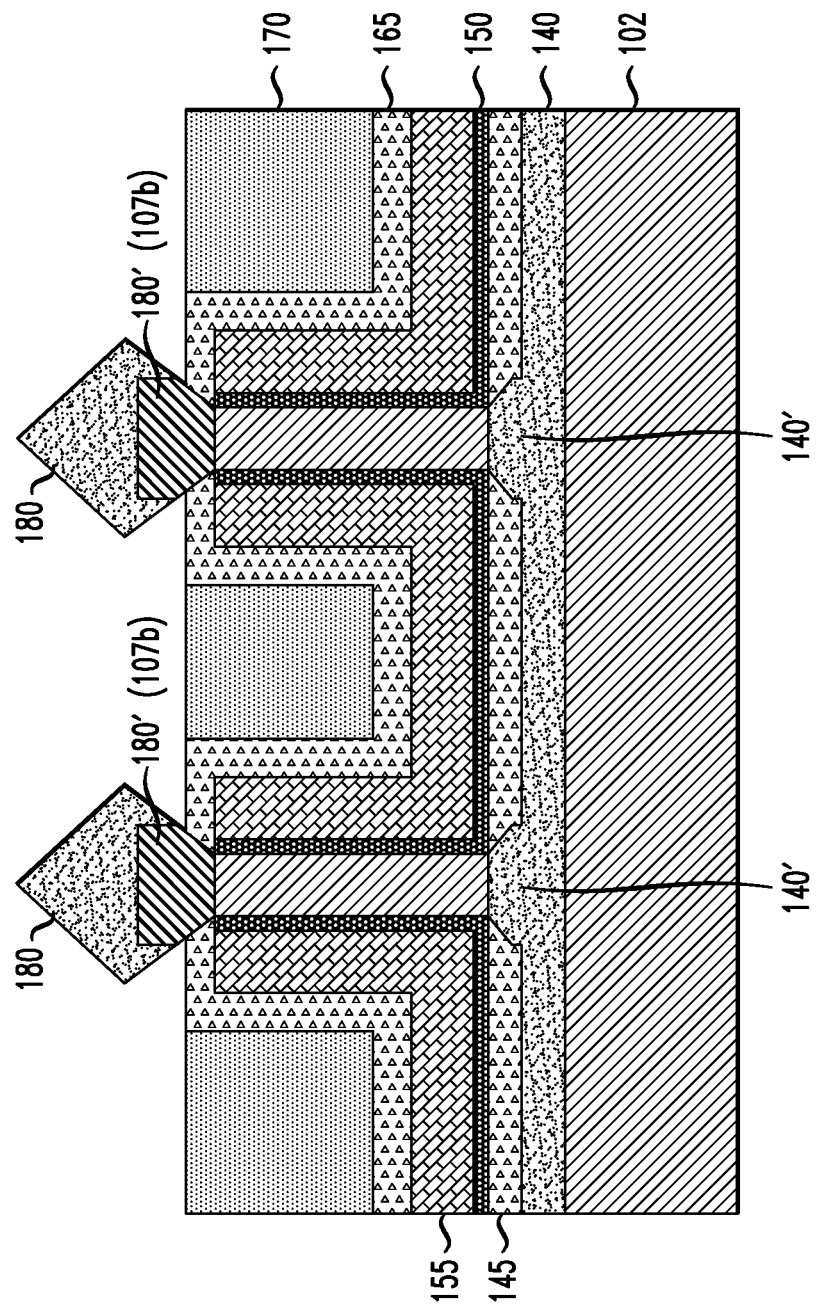
FIG. 9 is a cross-sectional view illustrating growth of top source/drain regions in a method of manufacturing a semiconductor device, according to an exemplary embodiment of the present invention.

FIG. 9 is a cross-sectional view illustrating growth of top source/drain regions in a method of manufacturing a semiconductor device, according to an exemplary embodiment of the present invention. Referring to FIG. 9, the hardmasks 110, upper portions of the gate encapsulation layer 165, which can comprise the same or similar material as the hardmasks 110, and upper portions of the dielectric layer 170 are selectively removed with respect to the SiGe portions 107b, using for example, a selective etch process. The selective etch process can include, for example, a wet etch process containing phosphoric acid, and removes the hardmasks 110, while recessing the combination of the gate encapsulation layer 165 and the dielectric layer 170 down to a base (e.g. lower) portion of each of the layers 107b.

Top source/drain regions 180 are epitaxially grown from the exposed portions of the layers 107b. In accordance with an embodiment of the present invention, for an nFET, an As or P doped source/drain region 180 is epitaxially grown. For a pFET, a B doped source/drain region 180 is epitaxially grown. Doping can be at concentrations in the general range of e19 to e21/$cm^3$. Top junction drive-in annealing similar to the annealing discussed in connection with the bottom source/drain region 140 or dopant implantation is performed to form top source-drain junctions 180'. In FIG. 9, the pattern and numbering for portions 107b has been retained in FIG. 9 to illustrate that epitaxial growth occurs from the portions 107b, and then dopant diffusion or implantation converts the portions 107b into top source/drain junctions 180'. Similar to what is described in connection with FIG. 6, the resulting top junctions 180' include the portions formerly labeled as 107b (now shown in parentheses in FIG. 9), which retain the same shape and include SiGe, but after diffusion also include the diffused dopant. The pattern from elements 107b is also retained in FIG. 9 to illustrate the retention of the shape of portions 107b after dopant diffusion or implantation.

As shown in FIG. 9, in accordance with an embodiment of the present invention, at least a bottom portion of source/drain junctions 140' (e.g., doped SiGe layers 107a after junction annealing) adjacent the bottom source/drain region 140 and a top portion of source/drain junctions 180' (e.g., doped SiGe layers 107b after junction annealing) adjacent the top source drain region 180 are at or near the original width of the patterned fins in FIG. 2, while the portions 105 have a uniform or substantially uniform width which is less than a width of the bottom portion of source/drain junctions 140' and the top portion of source/drain junctions 180'. As can be seen in FIG. 9, the fin including portions 140', 105 and 180' has an "I" shape.

As can be understood further downstream processing can be performed to form inter-level dielectric (ILD) layers and electrically conductive contact regions to gate structures and source/drain regions.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a first semiconductor layer comprising germanium on a semiconductor substrate;
   forming a second semiconductor layer on the first semiconductor layer;
   forming a third semiconductor layer comprising germanium on the second semiconductor layer;
   patterning the first, second and third semiconductor layers into at least one fin;
   forming a germanium oxide layer on the substrate and the at least one fin;
   performing an annealing process to convert the germanium oxide layer formed on the first and third semiconductor layers into silicon oxide;
   removing remaining portions of the germanium oxide layer from the at least one fin and the substrate;
   reducing a width of the second semiconductor layer of the at least one fin;
   growing a bottom source/drain region from the substrate adjacent a base portion of the at least one fin;
   forming a gate structure on and around the second semiconductor layer; and
   growing a top source/drain region from the third semiconductor layer.

2. The method according to claim 1, wherein the reducing of the width of the second semiconductor layer causes the first and third semiconductor layers to have a greater width than the second semiconductor layer.

3. The method according to claim 1, wherein the annealing process is performed in at least one of nitrogen, argon, xenon, helium, and hydrogen.

4. The method according to claim 3, wherein the annealing process is performed at a temperature of about 450° C.-about 650° C.

5. The method according to claim 1, wherein the second semiconductor layer comprises silicon and the first and third semiconductor layers comprise silicon germanium.

6. The method according to claim 5, wherein a percentage of germanium in the first and third semiconductor layers is less than about 20%.

7. The method according to claim 1, further comprising, prior to growing the bottom source/drain region:
   removing the silicon oxide from the first and third semiconductor layers; and
   forming a mask layer on exposed portions of the at least one fin.

8. The method according to claim 7, further comprising recessing portions of the substrate after forming the mask layer, wherein the bottom source/drain region is grown from the recessed portions of the substrate.

9. The method according to claim 1, further comprising performing junction annealing processes following the growing of the bottom and top source/drain regions.

10. The method according to claim 1, further comprising depositing a bottom spacer on the bottom source/drain region prior to forming the gate structure.

11. The method according to claim 1, wherein a hardmask layer is formed on the third semiconductor layer, the method further comprising conformally depositing a gate encapsulation layer on the gate structure, the third semiconductor layer and the hardmask layer.

12. The method according to claim 11, further comprising removing the hardmask layer and a portion of the gate encapsulation layer from the third semiconductor layer to expose at least a portion of the third semiconductor layer prior to the growing of the top source/drain region.

13. A method for manufacturing a vertical field-effect transistor, comprising:
   forming a first silicon germanium layer on a semiconductor substrate;
   forming a silicon layer on the first silicon germanium layer;
   forming a second silicon germanium layer on the silicon layer;
   patterning the first and second silicon germanium layers and the silicon layer into at least one fin;
   forming a germanium oxide layer on the substrate and the at least one fin;
   performing an annealing process to convert the germanium oxide layer formed on the first and second silicon germanium layers into silicon oxide;
   removing remaining portions of the germanium oxide layer from the at least one fin and the substrate;
   reducing a width of the silicon layer of the at least one fin;
   growing a bottom source/drain region from the substrate adjacent a base portion of the at least one fin;
   forming a gate structure on and around the silicon layer; and
   growing a top source/drain region from the second silicon germanium layer.

14. The method according to claim 13, wherein the reducing of the width of the silicon layer causes the first and second silicon germanium layers to have a greater width than the silicon layer.

15. The method according to claim 1, wherein the annealing process is performed in at least one of nitrogen, argon, xenon, helium, and hydrogen.

16. The method according to claim 15, wherein the annealing process is performed at a temperature of about 450° C. about 650° C.

17. The method according to claim 13, further comprising, prior to growing the bottom source/drain region:
- removing the silicon oxide from the first and second silicon germanium layers; and
- forming a mask layer on exposed portions of the at least one fin.

* * * * *